(12) United States Patent
Lee et al.

(10) Patent No.: US 10,229,995 B2
(45) Date of Patent: Mar. 12, 2019

(54) FABRICATING METHOD OF FIN STRUCTURE WITH TENSILE STRESS AND COMPLEMENTARY FINFET STRUCTURE

(71) Applicant: UNITED MICROELECTRONICS CORP., Hsin-Chu (TW)

(72) Inventors: Kai-Lin Lee, Kinmen County (TW); Zhi-Cheng Lee, Tainan (TW); Wei-Jen Chen, Tainan (TW); Ting-Hsuan Kang, Taichung (TW); Ren-Yu He, Taichung (TW); Hung-Wen Huang, New Taipei (TW); Chi-Hsiao Chen, Chiayi (TW); Hao-Hsiang Yang, Taoyuan (TW); An-Shih Shih, Taoyuan (TW); Chuang-Han Hsieh, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 18 days.

(21) Appl. No.: 15/668,719

(22) Filed: Aug. 4, 2017

(65) Prior Publication Data

US 2019/0027602 A1    Jan. 24, 2019

(30) Foreign Application Priority Data

Jul. 18, 2017    (CN) .......................... 2017 1 0584810

(51) Int. Cl.
*H01L 29/76*    (2006.01)
*H01L 29/78*    (2006.01)
(Continued)

(52) U.S. Cl.
CPC .... *H01L 29/7846* (2013.01); *H01L 21/76224* (2013.01); *H01L 21/823821* (2013.01);
(Continued)

(58) Field of Classification Search
CPC ........... H01L 29/7846; H01L 21/76224; H01L 21/823821; H01L 21/823878; H01L 27/0924; H01L 29/0653
(Continued)

(56) References Cited

U.S. PATENT DOCUMENTS 7,211,864 B2 *   5/2007   Seliskar .................. H01L 21/84
                                                     257/287
7,947,551 B1     5/2011   Syue
(Continued)

OTHER PUBLICATIONS

Nainani, IEDM 2012, pp. 18.3.1-18.3.4, "Is strain engineering scalable in FinFET era? : teaching the old dog some new tricks", Dec. 10, 2012.

(Continued)

*Primary Examiner* — Ori Nadav
(74) *Attorney, Agent, or Firm* — Winston Hsu

(57) ABSTRACT

A method of fabricating a fin structure with tensile stress includes providing a structure divided into an N-type transistor region and a P-type transistor region. Next, two first trenches and two second trenches are formed in the substrate. The first trenches define a fin structure. The second trenches segment the first trenches and the fin. Later, a flowable chemical vapor deposition is performed to form a silicon oxide layer filling the first trenches and the second trenches. Then, a patterned mask is formed only within the N-type transistor region. The patterned mask only covers the silicon oxide layer in the second trenches. Subsequently, part of the silicon oxide layer is removed to make the exposed silicon oxide layer lower than the top surface of the fin structure by taking the patterned mask as a mask. Finally, the patterned mask is removed.

5 Claims, 5 Drawing Sheets

(51) Int. Cl.
*H01L 27/092* (2006.01)
*H01L 29/06* (2006.01)
*H01L 21/8238* (2006.01)
*H01L 21/762* (2006.01)

(52) U.S. Cl.
CPC .. *H01L 21/823878* (2013.01); *H01L 27/0924* (2013.01); *H01L 29/0653* (2013.01)

(58) Field of Classification Search
USPC .......................................................... 257/369
See application file for complete search history.

(56) References Cited

U.S. PATENT DOCUMENTS

| | | | |
|---|---|---|---|
| 8,927,388 B2 | 1/2015 | Chen | |
| 8,941,153 B2* | 1/2015 | Lee ................. | H01L 21/823431 257/288 |
| 8,981,487 B2* | 3/2015 | Hung ................. | H01L 27/1211 257/327 |
| 9,224,737 B2* | 12/2015 | Chen ............... | H01L 21/823431 |
| 9,455,227 B1* | 9/2016 | Hung ............... | H01L 29/66545 |
| 9,589,970 B1* | 3/2017 | Tseng ............... | H01L 27/11206 |
| 9,659,943 B1* | 5/2017 | Tran .................. | H01L 27/11206 |
| 9,818,542 B2* | 11/2017 | Campi, Jr. ............. | B32B 27/00 |
| 9,824,931 B2* | 11/2017 | Tseng ............... | H01L 21/823481 |
| 9,917,103 B1* | 3/2018 | Mulfinger ............ | H01L 27/1203 |
| 9,953,880 B1* | 4/2018 | Lin ................. | H01L 21/823481 |
| 2006/0003597 A1* | 1/2006 | Golonzka ........... | H01L 21/3185 438/778 |
| 2006/0151833 A1* | 7/2006 | Yang ................. | H01L 21/76283 257/347 |
| 2009/0032874 A1* | 2/2009 | Loubet ............ | H01L 21/823412 257/350 |
| 2010/0317163 A1* | 12/2010 | Seliskar .......... | H01L 21/823487 438/155 |
| 2013/0330906 A1 | 12/2013 | Yu | |
| 2014/0346612 A1* | 11/2014 | Adam ............... | H01L 21/76205 257/397 |
| 2015/0200297 A1* | 7/2015 | Lee ..................... | H01L 29/7846 257/510 |
| 2016/0099181 A1* | 4/2016 | Tung ............... | H01L 21/823821 257/369 |
| 2016/0141420 A1* | 5/2016 | Chen .................. | H01L 29/7851 257/343 |
| 2017/0373144 A1* | 12/2017 | Pandey ............... | H01L 29/0653 |

OTHER PUBLICATIONS

Lim, IEDM 2010, pp. 10.1.1-10.1.4, "Novel Stress-Memorization-Technology (SMT) for High Electron Mobility Enhancement of Gate Last High-k/Metal Gate Devices", Dec. 6, 2010.

Chen, ASMC 2016, pp. 157-159, "Develop Gap-fill Process of Shallow Trench Isolation in 450mm Wafer by Advanced Flowable CVD Technology for Sub-20nm Node", May 16, 2016.

Hsu, Title of Invention: Complementary Metal Oxide Semiconductor Device and Method of Forming the Same, U.S. Appl. No. 15/446,009, filed Mar. 1, 2017.

Liou, Title of Invention: Semiconductor Device and Method for Fabricating the Same, U.S. Appl. No. 14/840,038, filed Aug. 30, 2015.

* cited by examiner

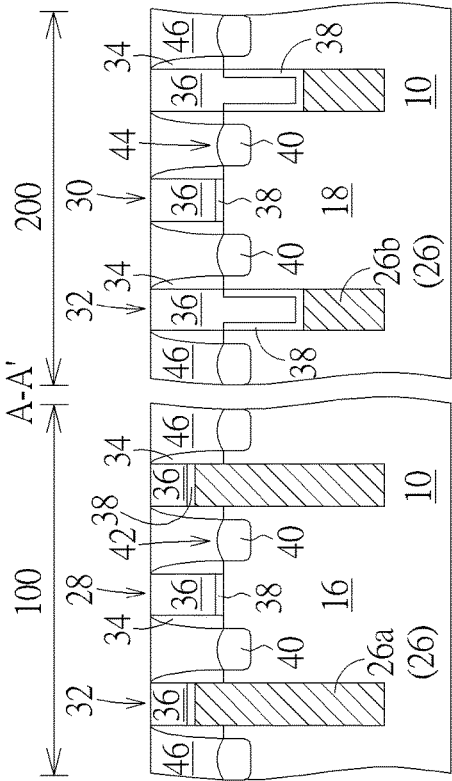
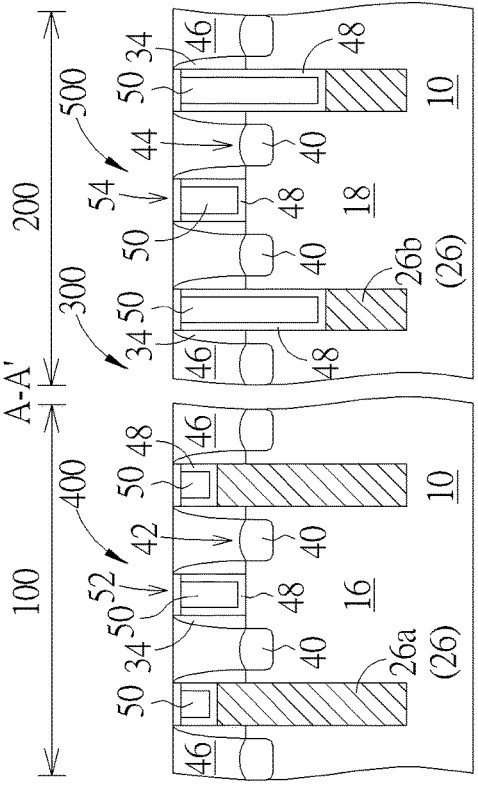
FIG. 7
FIG. 8

FABRICATING METHOD OF FIN STRUCTURE WITH TENSILE STRESS AND COMPLEMENTARY FINFET STRUCTURE

BACKGROUND OF THE INVENTION

1. Field of the Invention

The present invention relates to a method of fabricating a fin structure with tensile stress, and more particularly to a method of providing tensile stress by two single diffusion breaks.

2. Description of the Prior Art

As integrated circuits continue to be scaled downwards in size, the FinFET (Fin Field Effect Transistor) is becoming an attractive device. In a FinFET, the channel is formed by a semiconductor fin with a gate electrode located on at least two sides of the fin. Due to the advantageous feature of full depletion in a FinFET, there are an increased number of sides on which the gate electrode can control the channel of the FinFET, which enhances the controllability of the FinFET channel as compared to a planar MOSFET.

One way to influence charge carrier mobility in a channel is to create tensile or compressive stress in the channel region to produce a corresponding strain in the channel region which, in turn, results in a modified mobility for electrons and holes. Creating tensile strain in the channel region can enhance the performance of an N-type FinFET, while creating compressive strain in the channel region may enhance the performance of a P-type FinFET. Therefore, it would be desirable to provide a method which can form tensile or compressive stress individually in both N-type FinFET and P-type FinFET devices.

SUMMARY OF THE INVENTION

According to a first preferred embodiment of the present invention, a method of fabricating a fin structure with tensile stress includes providing a structure divided into an N-type transistor region and a P-type transistor region. Next, two first trenches and two second trenches are formed in the substrate. The first trenches define a fin structure. The second trenches segment the first trenches and the fin. Later, a flowable chemical vapor deposition is performed to form a silicon oxide layer which fills the first trenches and the second trenches. Then, a patterned mask is formed only within the N-type transistor region. The patterned mask only covers the silicon oxide layer in the second trenches. Subsequently, part of the silicon oxide layer is removed to make the exposed silicon oxide layer lower than the top surface of the fin structure by taking the patterned mask as a mask. Finally, the patterned mask is removed.

According to a second preferred embodiment of the present invention, a complementary FinFET structure includes an N-type FinFET and a P-type FinFET. The N-type FinFET includes a first fin structure, two shallow trench isolations respectively disposed at two sides of the first fin structure, two first single diffusion breaks respectively disposed at two ends of the first fin structure, wherein a top surface of each of the first single diffusion breaks is not lower than a top surface of the first fin structure, a first gate structure crossing the first fin structure, and two first source/drain doped regions respectively disposed in the first fin structure at two sides of the first gate structure. The P-type FinFET includes a second fin structure, the shallow trench isolations respectively disposed at two sides of the second fin structure, two second single diffusion breaks respectively disposed at two ends of the second fin structure, wherein a top surface of each of the second single diffusion breaks is lower than a top surface of the second fin structure, a second gate structure crossing the second fin structure, and two second source/drain doped regions respectively disposed in the second fin structure at two sides of the second gate structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 depict a fabricating method of a fin structure with tensile stress according to a first preferred embodiment of the present invention, wherein:

FIG. 1 shows a top view of a substrate, first trenches and second trenches;

FIG. 2 depicts a sectional view of FIG. 1 taken along line A-A', and line B-B';

FIG. 3 is a fabricating stage following FIG. 2;

FIG. 4 is a fabricating stage following FIG. 3;

FIG. 5 is a fabricating stage following FIG. 4;

FIG. 6 is a fabricating stage following FIG. 5;

FIG. 7 is a fabricating stage following FIG. 6; and

FIG. 8 is a fabricating stage following FIG. 7.

FIG. 9 to FIG. 10 depict a fabricating method of a fin structure with tensile stress according to a second preferred embodiment of the present invention, wherein:

FIG. 9 shows a top surface of a SDB aligned with a top surface of a first fin structure; and FIG. 10 is a fabricating stage following FIG. 9.

DETAILED DESCRIPTION

Figure 1:
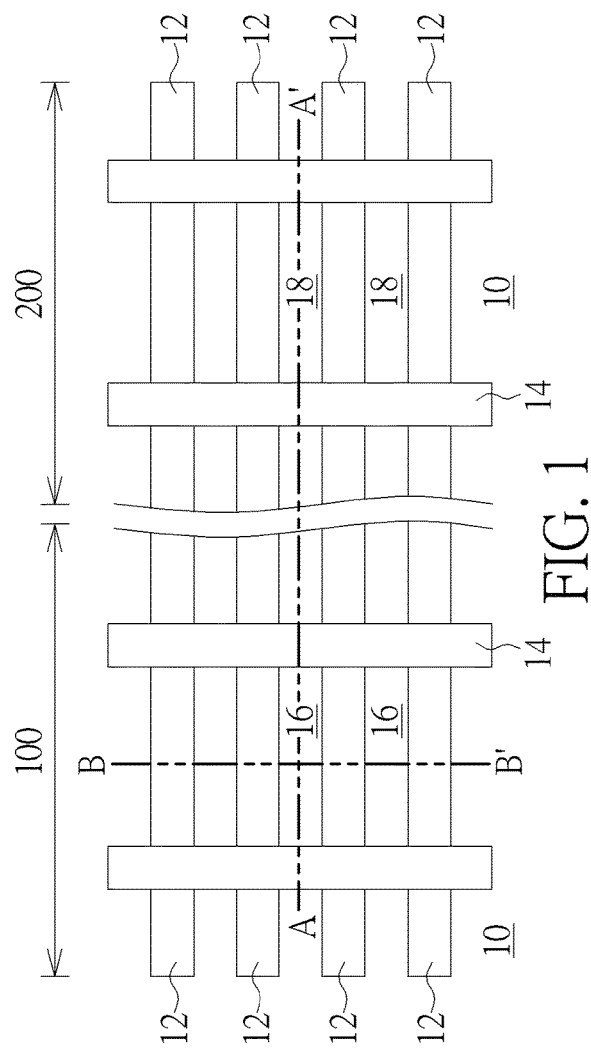
Figure 2:
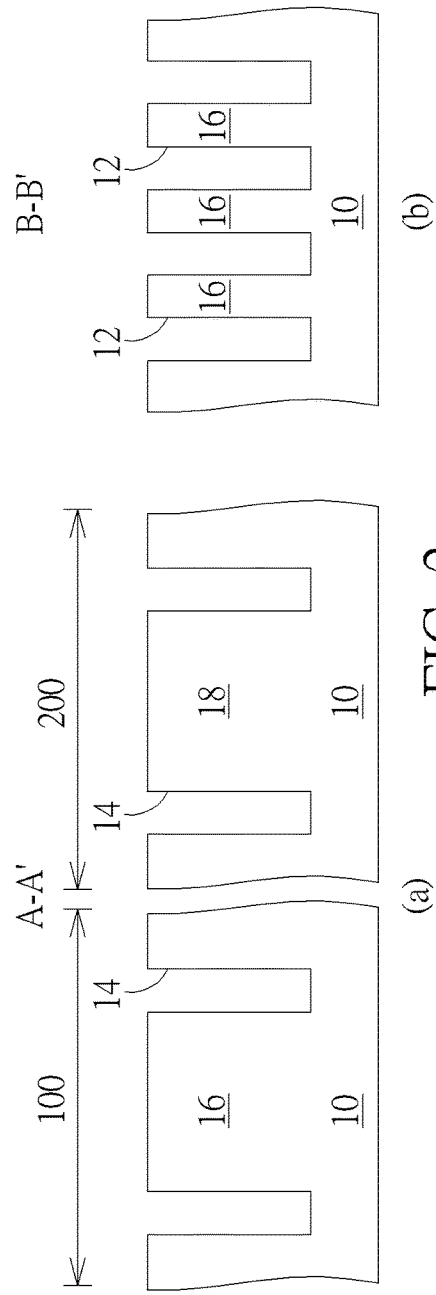
Figure 3:
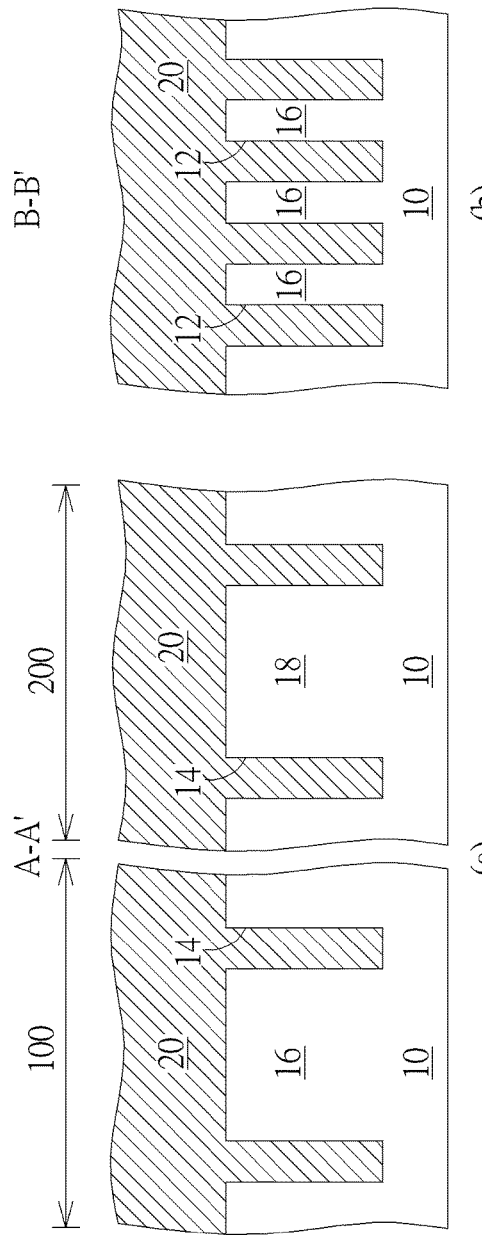

FIG. 1 to FIG. 8 depict a fabricating method of a fin structure with tensile stress according to a first preferred embodiment of the present invention, wherein FIG. 1 shows a top view of a substrate, first trenches and second trenches. Example (a) in FIG. 2 depicts a sectional view of FIG. 1 taken along line A-A'. Example (b) in FIG. 2 depicts a sectional view of FIG. 1 taken along line B-B'. FIG. 3 continues from FIG. 2, wherein Example (a) and Example (b) illustrated in FIG. 3 to FIG. 8 are continuations of Example (a) and Example (b) in the previous figure.

Please refer to FIG. 1 and FIG. 2. A substrate 10 such as a silicon substrate is provided. The substrate 10 is divided into an N-type transistor region 100 and a P-type transistor region 200. Next, numerous first trenches 12 and numerous second trenches 14 are formed within the substrate 10. The second trenches 14 segment the first trenches 12. In detail, each of the second trenches 14 crosses all of the first trenches 12. Two adjacent first trenches 12 define a long fin structure. Numerous second trenches 14 segment the long fin structure into numerous short fin structures. Each of the short fin structures within the N-type transistor region 100 is named as a first fin structure 16. Each of the short fin structures within the P-type transistor region 200 is named as a second fin structure 18. A top surface of the first fin structure 16 is aligned with a top surface of the second fin structure 18.

Figure 4:
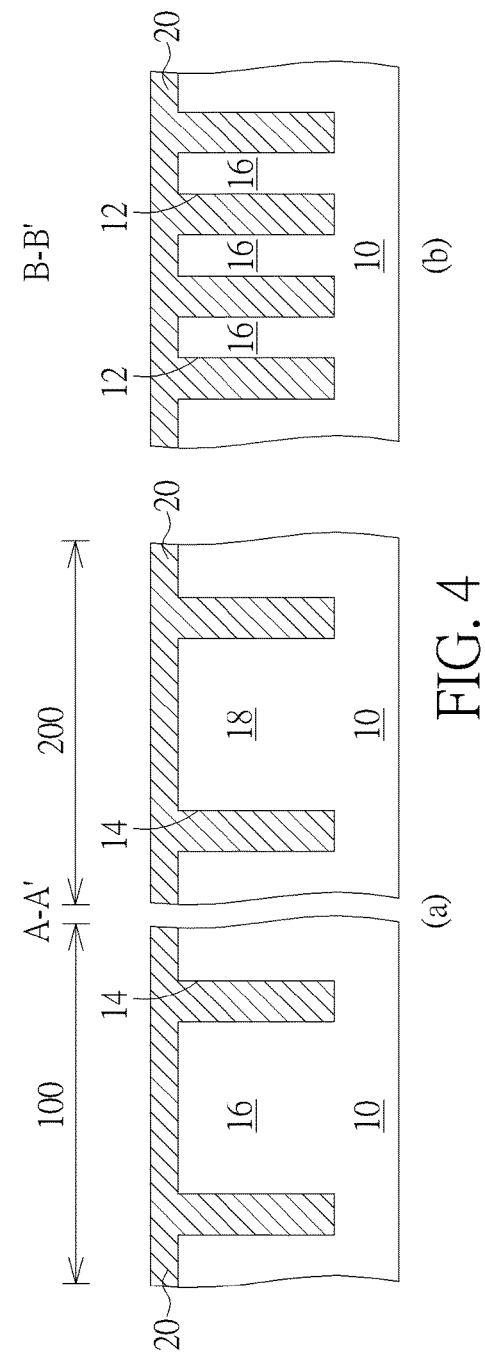

As shown in FIG. 3, a flowable chemical vapor deposition (FCVD) process is performed to form a silicon oxide layer 20 which covers the entire substrate 10 and fills each of the first trenches 12, and each of the second trenches 14. The FCVD process is performed by coating the silicon oxide layer 20 on the substrate 10 via spinning the wafer. After the FCVD, the silicon oxide layer 20 is densified by a thermal process. Later, as shown in FIG. 4, a planarization process is performed to planarize the silicon oxide layer 20, while maintaining the height of the top surface of the silicon oxide layer 20 as not lower than the top surface of the first fin structure 16 and the top surface of the second fin structure 18. FIG. 4 takes the top surface of the silicon oxide layer 20 being higher than the top surface of the first fin structure 16 and the top surface of the second fin structure 18 as an example.

Figure 5:
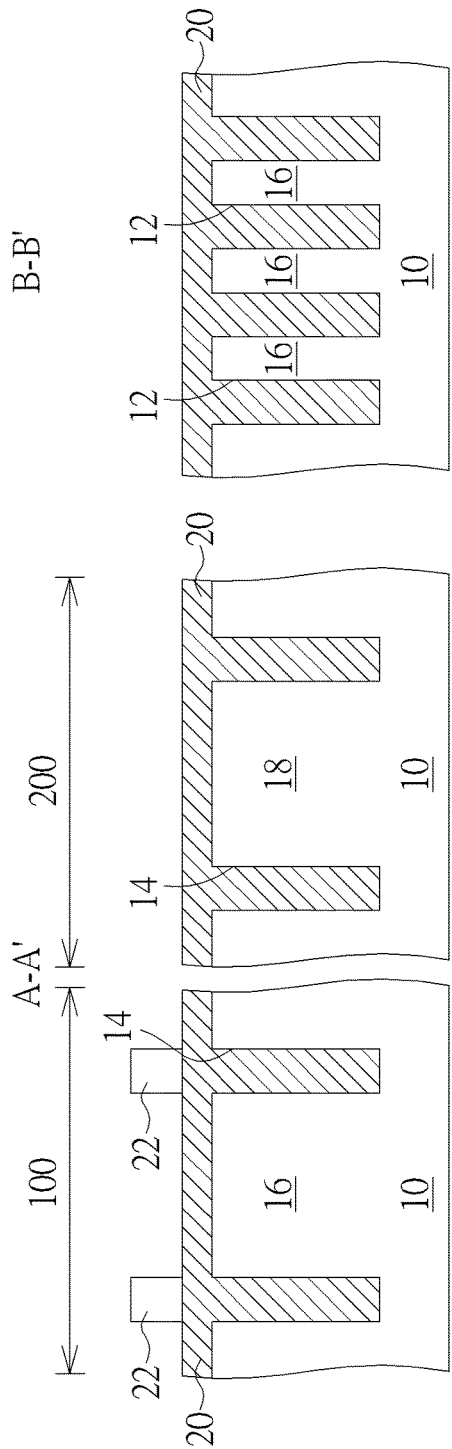
Figure 6:
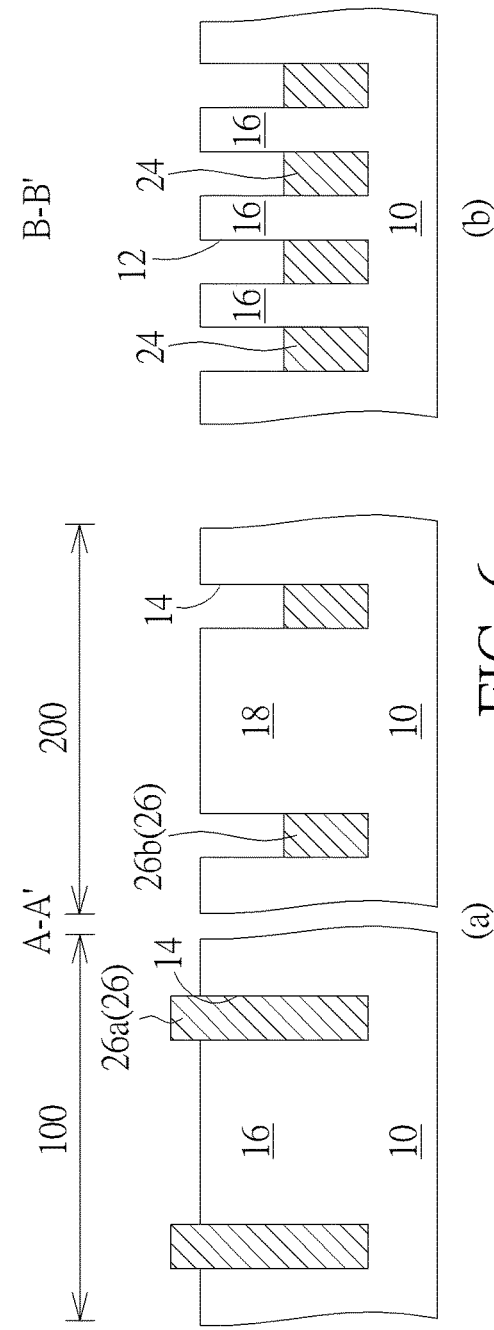

Refer to FIG. 5. A mask layer (not shown) is formed to entirely cover the substrate 10. The mask layer can be a photoresist. Then, the mask layer is patterned to become a patterned mask layer 22. The patterned mask layer 22 is only disposed within the N-type transistor region 100, and only overlaps the silicon oxide layer 20 within the second trenches 14. As shown in FIG. 6, part of the silicon oxide layer 22 is removed by taking the patterned mask layer 22 as a mask to make both the top surface of the silicon oxide layer 20 in the first trenches 12 within the N-type transistor region 100 and the top surface of the silicon oxide layer 20 within the P-type transistor region 200 lower than the top surface of the first fin structure 16 and the top surface of the second fin structure 18. At the same time, the horizontal surface of the substrate 10 is exposed. Then, the patterned mask layer 22 is removed. At this point, the silicon oxide layer 20 remaining in the first trenches 12 serves as a shallow trench isolation (STI) 24. Numerous STIs 24 are shown in this embodiment. The silicon oxide layer 20 remaining in the second trenches 14 serves as a single diffusion break (SDB) 26. In order to clearly describe the present invention, the SDB within the N-type transistor region 100 is designated as numeral 26a, and the SDB within the P-type transistor region 200 is designated as numeral 26b. There are two SDBs 26a respectively disposed at two ends of the first fins structure 16, and two SDBs 26b respectively disposed at two ends of the second fins structure 18. It is noteworthy that the positions of the SDBs 26a are protected by the patterned mask layer 22 while the silicon oxide layer 20 in other places is removed. Therefore, the top surfaces of the SDBs 26a within the N-type doped region 100 are not lower than the top surface of the first fin structure 16. The positions of the SDBs 26b within the P-type doped region 200 and the STIs 24 on the substrate 10 are not covered by the patterned mask layer 22; therefore, the SDBs 26b and the STIs 24 are formed simultaneously so the top surfaces of the SDBs 26b and the top surfaces of the STIs 24 are all lower than the top surface of the first fin structure 16 and second fin structure 18. Moreover, the top surfaces of the SDB 26b are aligned with the top surfaces of the STIs 24.

The silicon oxide layer 20 formed by the FCVD process contains tensile stress. The top surfaces of the SDB 26a are not lower than the top surface of the first fin structure 16, and the SDBs 26a sandwich the first fin structure 16 within the N-type doped region 100. Therefore, the silicon oxide layer 20 can provide tensile stress to the first fin structure 16. The top surfaces of the SDBs 26b at two ends of the second fin structure 18, however, are lower than the top surface of the second fin structure 18, meaning the SDBs 26b do not provide tensile stress to the second fin structure 18. If compressive stress needs to be added to the second fin structure 18, a compressive material (not shown) such as silicon nitride can be formed within each of the second trenches 14, wherein the top surface of the compressive material is higher than the top surface of the second fin structure 16.

Next, as shown in FIG. 7, a gate structure process is performed to form a first gate structure 28 and the second gate structure 30 on, respectively, the first fin structure 16 and the second fin structure 18. A passing gate structure 32 is formed on each of the SDBs 26a/26b. There are four passing gate structures 32 shown in this embodiment. A spacer 34 is formed on the first gate structure 28, the second gate structure 30, and the passing gate structures 32. The sidewalls of the passing gate structures may not cross the sidewalls of the SDBs 26a/26b. In another embodiment, the sidewalls of the passing gate structures may cross the sidewalls of the SDBs 26a/26b and directly contact the first fin structure 16 or the second fin structure 18. The first gate structure 28, the second gate structure 30 and the passing gate structure 32 respectively include a polysilicon gate 36 and a dielectric layer 38. Later, recesses (not shown) are formed in the first fin structure 16 and the second fin structure 18 at two sides of the first gate structure 28, the second gate structure 30 and the passing gate structure 32. Then, an epitaxial layer 40 fills in the recesses. N-type dopants are implanted into the epitaxial layer 40 in the first fin structure 16, and the epitaxial layer 40 in the first fin structure 16 serves as a source/drain doped regions 42. P-type dopants are implanted into the epitaxial layer 40 in the second fin structure 18, and the epitaxial layer 40 in the second fin structure 18 serves as a source/drain doped regions 44. According to another preferred embodiment of the present invention, the source/drain doped regions 42 and the source/drain doped regions 44 can be formed by implanting dopants into the substrate 10 without forming the epitaxial layer 40. Subsequently, an interlayer dielectric 46 is formed. Next, contact plugs can be formed in the interlayer dielectric 46 to connect the source/drain doped regions 42/44.

As shown in FIG. 8, if a metal gate is needed in the transistor formed afterwards, a replacement metal gate process can be performed after the contact plugs are formed. The replacement metal gate process can be performed by the steps of removing the first gate structure 28, the second gate structure 30 and the passing gate structures 32 to form numerous recesses (not shown). Then, a gate dielectric layer 48 and a work function layer (not shown) fill into the recesses. The gate dielectric layer 48 is generally made of high-k dielectric materials. In addition, the gate dielectric layer 48 and the work function layer can be altered based on different requirements. Next, the metal gate 50 is formed on the work function layer. The metal gate 50, the gate dielectric layer 48 and the work function layer within the N-type transistor region 100 serve as a first metal gate structure 52. The metal gate 50, the gate dielectric layer 48 and the work function layer within the P-type transistor region 200 serve as a second metal gate structure 54. Because the replacement metal gate process is a conventional process, the details of this process are omitted. At this point, a complementary FinFET structure 300 is completed.

Figure 9:
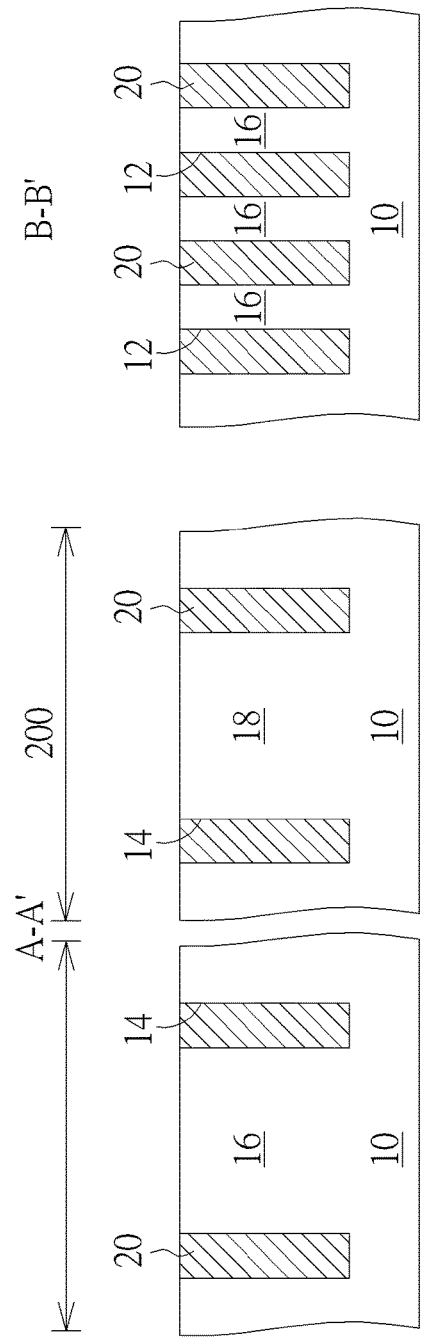
Figure 10:
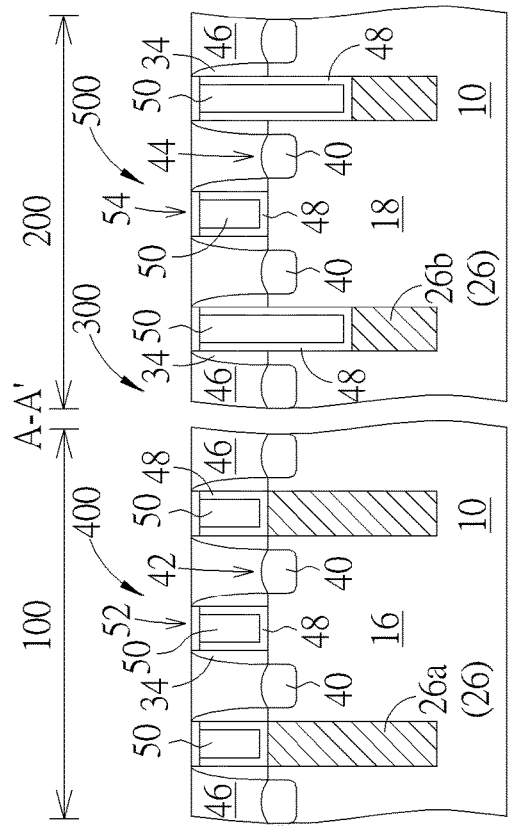

As shown in FIG. 9, according to another preferred embodiment of the present invention, during the planarization process, the top surface silicon oxide layer 20 can become aligned with the top surface of the first fin structure 16. The following process is the same as that in the FIG. 5 to FIG. 8, and another complementary FinFET structure 300 can be formed as shown in FIG. 10. The feature of the complementary FinFET structure 300 in FIG. 10 is that the top surface of the SDBs 26a is aligned with the first fin structure 16.

As shown in FIG. 8, a complementary FinFET structure 300 includes a substrate 10. The substrate 10 is divided into an N-type transistor region 100 and a P-type transistor region 200. An N-type FinFET 400 and a P-type FinFET 500 are respectively disposed within the N-type transistor region 100 and the P-type transistor region 200. The N-type FinFET 400 includes a first fin structure 16, and two STIs 24 respectively disposed at two sides of the first fin structure 16. Two SDBs 26a are respectively disposed at two ends of the first fin structure 16. A top surface of each of the SDBs 26a is not lower than a top surface of the first fin structure 16. FIG. 8 takes the top surface of the SDBs 26a being higher than the top surface of the first fin structure 16 as an example. A first gate structure such as a first metal gate structure 52 crosses the first fin structure 16. Two first source/drain doped regions 42 are respectively disposed in the first fin structure 16 at two sides of the first metal gate structure 52. The P-type FinFET 500 includes a second fin structure 18 and two STIs 24 respectively disposed at two sides of the second fin structure 18. The relative position of the STIs 24 disposed at two sides of the second fin structure 18 is the same as the relative position of the STIs 24 disposed at two sides of the first fin structure 16, please refer to the position of the STIs 24 and the first fin structure 16. Two SDBs 26b are respectively disposed at two ends of the second fin structure 18. A top surface of each of the SDBs 26b is lower than a top surface of the second fin structure 18. A second gate structure such as a second metal gate structure 54 crosses the second fin structure 18. Two second source/drain doped regions 44 are respectively disposed in the second fin structure 18 at two sides of the second metal gate structure 54.

It is noteworthy that there are two SDBs 26a at two ends of the first fin structure 16 of the N-type FinFET 400. The SDBs 26a are made of the silicon oxide layer 20 formed by the FCVD process. Therefore, the SDBs 26a provide tensile stress to the first fin structure 16. As a result, the channel region of the N-type FinFET 400 contains tensile stress, and the electron mobility is increased. As tensile stress is not needed in the P-type FinFET 500, the top surface of the SDBs 26b at two ends of the second fin structure 18 is lower than the top surface of the second fin structure 18.

According to another preferred embodiment of the present invention, a top surface of the SDBs 26a can be aligned with the top surface of the first fin structure 16 as shown in FIG. 10. The top surface of the SDBs 26a at two ends of the first fin structure 16 are aligned with the top surface of the first fin structure 16 to provide the tensile stress for the N-type FinFET 400. Other elements are the same as those in FIG. 8, and therefore omitted here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A complementary FinFET structure, comprising:
an N-type FinFET comprising:
 a first fin structure;
 two shallow trench isolations respectively disposed at two sides of the first fin structure;
 two first single diffusion breaks respectively disposed at two ends of the first fin structure, wherein the topmost surface of each of the first single diffusion breaks is not lower than the topmost surface of the first fin structure;
 a first gate structure crossing the first fin structure; and
 two first source/drain doped regions respectively disposed in the first fin structure at two sides of the first gate structure; and
a P-type FinFET comprising:
 a second fin structure;
 the shallow trench isolations respectively disposed at two sides of the second fin structure;
 two second single diffusion breaks respectively disposed at two ends of the second fin structure, wherein the topmost surface of each of the second single diffusion breaks is lower than the topmost surface of the second fin structure, the topmost surface of each of the second single diffusion breaks is aligned with the topmost surface of each of the shallow trench isolations, and a bottommost surface of each of the first single diffusion breaks, a bottommost surface of each of the second single diffusion breaks, a bottommost surface of each of the shallow trench isolations are aligned;
 a second gate structure crossing the second fin structure; and
 two second source/drain doped regions respectively disposed in the second fin structure at two sides of the second gate structure.

2. The complementary FinFET structure of claim 1, wherein the topmost surface of each of the first single diffusion breaks is higher than the topmost surface of the first fin structure.

3. The complementary FinFET structure of claim 1, wherein the topmost surface of each of the first single diffusion breaks is aligned with the topmost surface of the first fin structure.

4. The complementary FinFET structure of claim 1, wherein the topmost surface of each of the first single diffusion breaks is higher than the topmost surface of each of the shallow trench isolations.

5. The complementary FinFET structure of claim 1, wherein the topmost surface of the first fin structure is aligned with the topmost surface of the second fin structure.

* * * * *